United States Patent
Ezaki et al.

(10) Patent No.: US 7,485,593 B2
(45) Date of Patent: Feb. 3, 2009

(54) TITANIA-SILICA GLASS

(75) Inventors: Masanobu Ezaki, Hadano (JP); Masashi Kobata, Hadano (JP); Sachiko Kato, Hadano (JP)

(73) Assignee: Covalent Materials Corporation, Tokyo (JP)

( * ) Notice: Subject to any disclaimer, the term of this patent is extended or adjusted under 35 U.S.C. 154(b) by 0 days.

(21) Appl. No.: 11/874,373

(22) Filed: Oct. 18, 2007

(65) Prior Publication Data

US 2008/0096756 A1  Apr. 24, 2008

(30) Foreign Application Priority Data

Oct. 20, 2006   (JP)   ............................ 2006-286740

(51) Int. Cl.
*C03C 3/06* (2006.01)
*C03C 3/076* (2006.01)
*C03B 20/00* (2006.01)
*C03B 32/00* (2006.01)

(52) U.S. Cl. ........................... 501/54; 501/55; 65/17.1; 65/30.1; 65/30.13; 65/32.1; 65/33.1

(58) Field of Classification Search ................... 501/54, 501/55; 65/17.1, 30.1, 30.13, 32.1, 33.1, 65/111

See application file for complete search history.

(56) References Cited

FOREIGN PATENT DOCUMENTS

| JP | 60-176945 A | * | 9/1985 |
| JP | 2003-505876 | | 2/2003 |
| WO | WO2006/004169 A1 | * | 1/2006 |
| WO | WO2006/080241 A2 | * | 8/2006 |

* cited by examiner

*Primary Examiner*—Anthony J Green
(74) *Attorney, Agent, or Firm*—Foley & Lardner LLP

(57) ABSTRACT

To provide titania-silica glass which is transparent glass of low thermal expansion, in particular, is of a low thermal expansion coefficient over a wide range of temperatures of 0 to 100° C. (an operating temperature range) when it is used as a photomask or a mirror material in extreme ultraviolet ray lithography, and which is excellent in homogeneity within the field and stability.

Titania-silica glass is used which has 8 to 10% by weight of titania and 90 to 92% by weight of silica, where a $Ti^{3+}$ concentration is 10 to 60 ppm by weight.

9 Claims, No Drawings

TITANIA-SILICA GLASS

This application claims priority from Japanese Patent Application 2006-286740, filed Oct. 10, 2006, which is incorporated herein by reference in its entirety.

BACKGROUND OF THE INVENTION

1. Field of the Invention

The present invention relates to silica glass including titania, and particularly relates to titania-silica glass suitably used as a photomask material for extreme ultraviolet ray lithography (hereafter referred to as EUV lithography) in a manufacturing process for a semiconductor, a liquid crystal, etc.

2. Description of the Related Art

In high integration of a semiconductor integrated circuit in recent years, an ultra-fine processing technology plays the most important role. As the semiconductor integrated circuit is subjected to a finer process, development of optical lithography technologies is also progressing. The EUV lithography using an EUV ray for an exposure light source attracts attention as one of them.

Since this EUV ray has a wavelength of 13.5 nm or less and is absorbed by any material, a lithography system of a catoptric system is employed.

In the EUV lithography, since a photomask substrate is irradiated with a high power laser, it requires a thermal stability in the order of subnanometers.

Therefore, as a material of the photomask substrate, the glass is needed which has a thermal expansion coefficient lower than that of the silica glass used for the conventional photolithography.

As an example of such glass having a low thermal expansion coefficient, titania-silica glass is known.

For example, Published Japanese Translation (of PCT Application) No. 2003-505876 discloses that the silica glass is used which includes 5 to 10% by weight of titania and has a thermal expansion coefficient within a range of ±10 ppb at 20° C.

Generally, such titania-silica glass as described above is manufactured in such a way that a mixture of a silica precursor and a titania precursor in a steam form is hydrolyzed by a burner in an oxy-hydrogen flame, and titania-silica glass particles are deposited and melted at the same time.

However, in the above-mentioned manufacture method, a glass body is directly formed by hydrolyzing the titania precursor and the silica precursor. Thus, a titanium ion of titania which is athermal is tetravalent ($Ti^{4+}$) in an oxidization atmosphere, and a titanium atom is a constituent member of a glass network where a silicon atom is replaced with the titanium atom. The glass which has such a network tends to be influenced by temperature, and its thermal expansion coefficient is larger at a higher temperature.

Thus, in the titania-silica glass of a two-part system, since its thermal expansion coefficient tends to be influenced by a titania content and temperature, it is difficult to obtain glass having a low thermal expansion coefficient which is excellent in homogeneity within a field and has excellent stability.

SUMMARY OF THE INVENTION

The present invention is made in order to solve the above-mentioned technical problems, and provide titania-silica glass which is transparent glass of low thermal expansion coefficient, in particular, is of a low thermal expansion coefficient over a wide range of temperatures of 0 to 100° C. (an operating temperature range) when it is used as a photomask or a mirror material in EUV lithography, and which is excellent in homogeneity within the field, and stability.

The titania-silica glass in accordance with the present invention is characterized by having 8 to 10% by weight of titania and 90 to 92% by weight of silica, in which a $Ti^{3+}$ concentration is 10 to 60 ppm by weight.

The titania-silica glass having such specific constituent elements as mentioned above has the low thermal expansion coefficient at 0 to 100° C., and may be glass whose thermal expansion coefficient is excellent also in homogeneity within the field and stability, and which is excellent in transparency.

Such titania-silica glass as mentioned above can be used suitably for the photomask in the EUV lithography.

It is preferable that such transparent glass of low thermal expansion, as described above, is used as a photomask material, since an exposure pattern shift resulting from deformation of a mask due to a temperature change can be prevented.

As described above, the titania-silica glass in accordance with the present invention is of the low thermal expansion, has no air-bubbles, and is transparent. Thus, in the case where it is used as the photomask material, it is excellent in homogeneity within the field and stability in terms of the thermal expansion coefficient at around an operating temperature, and can prevent the exposure pattern shift resulting from deformation of the mask due to the temperature change.

Therefore, the above-mentioned titania-silica glass can be suitably used as the photomask material, and can be especially used suitably in the EUV lithography in a process of manufacturing a semiconductor, a liquid crystal, etc., thus contributing to improvement in yield in various processing processes for the semiconductor, the liquid crystal, etc.

DESCRIPTION OF THE PREFERRED EMBODIMENTS

Hereafter, the present invention will be described in detail.

Titania-silica glass in accordance with the present invention is of 8 to 10% by weight of titania and 90 to 92% by weight of silica, and includes $Ti^{3+}$ at a concentration of 10 to 60 ppm by weight.

In the titania-silica glass in accordance with the present invention, titanium is reduced to $Ti^{3+}$, so that a coordination number of an oxygen atom is six (6 coordination), thus it is possible for titania to exist separately from the silica glass network, whereby an athermal nature of titanium oxide can be more homogeneous.

Therefore, a titania content can be higher than a conventional one, and it shows a low thermal expansion nature over a wide temperature range. Further, it may be glass having a positive thermal expansion coefficient.

In the above-mentioned titania-silica glass, the titania content is 8 to 10% by weight.

If the titania content exceeds 10%, it shows a negative thermal expansion coefficient with a large absolute value, which is not preferred. On the other hand, when the above-mentioned content is less than 8% by weight, the low thermal expansion effect by the titania which shows athermal nature cannot fully be acquired.

More preferably, the above-mentioned titania content is 8 to 9% by weight.

Further, a $Ti^{3+}$ concentration in the above-mentioned titania-silica glass is 10 to 60 ppm by weight.

If the $Ti^{3+}$ concentration exceeds the 60 ppm by weight, a crystalline material substance separates and sufficient transparency may not be acquired. On the other hand, when the $Ti^{3+}$ concentration is less than 10 ppm by weight, there is too little titania which exists separately from the silica glass network as described above, and a sufficient low thermal expansion effect is not obtained.

More preferably the above-mentioned the $Ti^{3+}$ concentration is 10 to 40 ppm by weight.

The reduction of titanium of the above-mentioned titania to the $Ti^{3+}$ may be carried out in such a way that a titania-silica porous body produced by the VAD process (a type of soot process) etc. is vitrified at 1200° C. or more in a vacuum or inert gas atmosphere in a furnace containing a component which acts as a reducing agent, such as carbon.

In particular, it is preferable to employ a manufacture method in accordance with the present invention as will be described in detail hereafter.

The titania-silica glass including the above-mentioned constituent elements is of the low thermal expansion (where the thermal expansion coefficient is within a range of ±20 ppb/° C. at 0 to 100° C.) and is excellent in homogeneity within the field and stability in terms of the thermal expansion coefficient.

Therefore, in the case where it is used as the photomask or mirror material in the EUV lithography, the mask is prevented from deforming with the changes of temperature, which causes an exposure pattern shift, thus being a suitable mask material.

As for air bubbles, particularly the above-mentioned titania-silica glass is more preferably transparent glass which has substantially no air bubbles (1/cm$^3$ or less) when it is used as the photomask material in such an EUV lithography as mentioned above.

Such titania-silica glass as mentioned above in accordance with the present invention can be particularly obtained in such a way that the titania-silica porous body containing 8 to 10% by weight of titania produced by the VAD method is heat-treated and made into half-sintered titania-silica, which is subjected to a vitrification process at 1600 to 1800° C. and 0.1 to 1 MPa in a vacuum atmosphere using a mold made of carbon.

In addition, in the above-mentioned vitrification process, in order to raise the reduction nature of titania to allow the above-mentioned $Ti^{3+}$ concentration, it is possible to introduce reduction gases, such as hydrogen gas and carbon monoxide gas into the above-mentioned atmosphere.

Hereafter, the present invention will be described more particularly with reference to Examples, however the present invention is not limited to the following Examples.

EXAMPLE 1

By way of the VAD method, a titania-silica porous body of a titania content of 9% by weight was prepared to make a half-sintered body at 1300 to 1500° C. by a zone sinter system.

This was heat-treated at 1600 to 1800° C. in a vacuum atmosphere within a container made from carbon, so that a 152 mm×152 mm brown transparent glass body with a thickness of 6.35 mm was acquired.

EXAMPLES 2 AND 3

Each transparent glass body was prepared by changing the atmosphere in the case of the vitrification process into a reduction atmosphere, and others were similar to Example 1.

COMPARATIVE EXAMPLES 1 AND 2

Transparent glass bodies were prepared in such a way that the titania contents of the titania-silica porous body were 5% by weight (Comparative Example 1) and 7% by weight (comparative example 2), and others were similar to Example 1.

COMPARATIVE EXAMPLE 3

A transparent glass body was prepared in such a way that the atmosphere in the case of the vitrification process was a helium atmosphere, and others were similar to Example 1.

COMPARATIVE EXAMPLE 4

A transparent glass body was prepared in such a way that the titania content of titania-silica porous body was 11% by weight and the container used in the case of the vitrification process was made of molybdenum, and others were similar to the Example 1.

Each of the glass bodies obtained by the above-mentioned Examples and Comparative Examples was subjected to a quantitative analysis of the titania concentration with an ICP luminescence analysis equipment. Further, an analysis of the number of valences of titanium ion was carried out by an electron spin resonance (ESR) method, and found the $Ti^{3+}$ concentration.

Further, each of the above-mentioned glass bodies was divided into four pieces of the same shape, and thermal expansion coefficient measurement was performed with a laser interference type thermal expansion measurement equipment for each.

These results are collectively shown in Table 1.

TABLE 1

| | $TiO_2$ concentration (wt %) | $Ti^{3+}$ concentration (wt ppm) | thermal expansion coefficient (0 to 100° C.) (ppb/° C.) |
|---|---|---|---|
| Example 1 | 9 | 20 | −10 to 10 |
| Example 2 | 8 | 10 | 0 to 20 |
| Example 3 | 10 | 60 | −20 to 0 |
| Comparative Example 1 | 5 | 20 | 100 to 200 |
| Comparative Example 2 | 7 | 20 | 25 to 50 |
| Comparative Example 3 | 7 | 6 | 40 to 70 |
| Comparative Example 4 | 13 | 30 | −50 to −15 |

As shown in Table 1, it is found that titania-silica glass whose titania concentration is 8 to 10% by weight and whose $Ti^{3+}$ concentration is 10 to 60 ppm by weight, is of low thermal expansion within a wide temperature range of 0 to 100° C. and excellent in homogeneity of the thermal expansion coefficient.

What is claimed is:

1. A titania-silica glass, comprising 8 to 10% by weight of titania and 90 to 92% by weight of silica, in which a $Ti^{3+}$ concentration is 10 to 60 ppm by weight.

2. The titania-silica glass of claim 1, wherein the $Ti^{3+}$ concentration is 10 to 40 ppm by weight.

3. The titania-silica glass of claim 1, wherein a thermal expansion coefficient of the glass is within a range of ±20 ppb/° C. at 0 to 100° C.

4. A titania-silica glass, comprising 8 to 10% by weight of titania and 90 to 92% by weight of silica, wherein a $Ti^{3+}$ concentration is 10 to 60 ppm by weight,
    wherein the titania-silica glass is produced by a process that includes a vitrification step that uses a reducing atmosphere, wherein the reducing atmosphere reduces at least a portion of the titania to the $Ti^{3+}$.

5. The titania-silica glass of claim 4, wherein the $Ti^{3+}$ concentration is 10 to 40 ppm by weight.

6. The titania-silica glass of claim 4, wherein a thermal expansion coefficient of the glass is within a range of ±20 ppb/° C. at 0 to 100° C.

7. A method of producing a titania-silica glass, comprising:
providing a titania-silica porous body,
heat-treating the titania-silica porous body, and
performing a vitrification step using a reducing atmosphere on the heat-treated titania-silica porous body to produce a titania-silica glass, wherein the titania-silica glass comprises 8 to 10% by weight of titania and 90 to 92% by weight of silica, wherein a $Ti^{3+}$ concentration is 10 to 60 ppm by weight,
wherein the reducing atmosphere of the vitrification step reduces at least a portion of the titania to the $Ti^{3+}$.

8. The method of claim 7, wherein the $Ti^{3+}$ concentration is 10 to 40 ppm by weight.

9. The method of claim 7, wherein a thermal expansion coefficient of the titania-silica glass is within a range of ±20 ppb/° C. at 0 to 100° C.

* * * * *